US008877631B2

(12) United States Patent
Engelhardt et al.

(10) Patent No.: US 8,877,631 B2
(45) Date of Patent: Nov. 4, 2014

(54) INTERCONNECT ARRANGEMENT AND ASSOCIATED PRODUCTION METHODS

(75) Inventors: Manfred Engelhardt, Villach Landskron (DE); Werner Pamler, Munich (DE); Guenther Schindler, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/110,022

(22) Filed: May 18, 2011

(65) Prior Publication Data

US 2011/0217839 A1     Sep. 8, 2011

Related U.S. Application Data

(62) Division of application No. 11/362,269, filed on Feb. 22, 2006, now abandoned.

(30) Foreign Application Priority Data

Feb. 24, 2005   (DE) .................. 10 2005 008 476

(51) Int. Cl.
H01L 21/4763   (2006.01)
H01L 23/522    (2006.01)
H01L 23/532    (2006.01)
H01L 21/768    (2006.01)
H01L 27/108    (2006.01)

(52) U.S. Cl.
CPC ........ H01L 21/7681 (2013.01); H01L 23/5222 (2013.01); H01L 23/53295 (2013.01); H01L 27/10885 (2013.01)
USPC .......................................... 438/622; 438/624

(58) Field of Classification Search
USPC ................................................ 438/622, 624
See application file for complete search history.

(56) References Cited

U.S. PATENT DOCUMENTS

| 5,461,003 | A | 10/1995 | Havemann et al. |
| 6,307,263 | B1 | 10/2001 | Savignac et al. |
| 6,737,725 | B2 | 5/2004 | Grill et al. |
| 2004/0140506 | A1* | 7/2004 | Singh et al. ................... 257/367 |
| 2004/0147111 | A1* | 7/2004 | Huang et al. .................. 438/624 |
| 2004/0164419 | A1 | 8/2004 | Ahn et al. |
| 2005/0070088 | A1* | 3/2005 | Lu ................................. 438/624 |
| 2005/0164489 | A1* | 7/2005 | Kloster et al. ................ 438/622 |
| 2005/0179135 | A1* | 8/2005 | Kumar .......................... 257/758 |
| 2005/0239280 | A1* | 10/2005 | Lee .............................. 438/624 |

FOREIGN PATENT DOCUMENTS

| DE | 4441898 C1 | 4/1996 |
| DE | 19834234 A1 | 2/2000 |
| EP | 0476625 A2 | 3/1992 |
| EP | 0603104 A1 | 6/2004 |

* cited by examiner

Primary Examiner — Phat X Cao
(74) Attorney, Agent, or Firm — Schiff Hardin LLP

(57) ABSTRACT

An interconnect arrangement and fabrication method are described. The interconnect arrangement includes an electrically conductive mount substrate, a dielectric layer formed on the mount substrate, and an electrically conductive interconnect formed on the dielectric layer. At least a portion of the dielectric layer under the interconnect contains a cavity. To fabricate the interconnect arrangement, a sacrificial layer is formed on the mount substrate and the interconnect layer is formed on the sacrificial layer. The interconnect layer and the sacrificial layer are structured to produce a structured interconnect on the structured sacrificial layer. A porous dielectric layer is formed on a surface of the mount substrate and of the structured interconnect as well as the sacrificial layer. The sacrificial layer is then removed to form the cavity under the interconnect.

10 Claims, 11 Drawing Sheets

INTERCONNECT ARRANGEMENT AND ASSOCIATED PRODUCTION METHODS

PRIORITY CLAIM

This application is a divisional application of U.S. patent application Ser. No. 11/362,269, filed on Feb. 26, 2006. U.S. patent application Ser. No. 11/362,269 is hereby incorporated by reference herein. U.S. patent application Ser. No. 11/362,269 claims priority to German Patent Application DE 10 2005 008 476.1, filed on Feb. 24, 2005, which is hereby incorporated by reference herein.

TECHNICAL FIELD

The present invention relates to an interconnect arrangement and to associated production methods, and in particular to an interconnect arrangement with improved electrical characteristics as can be used as a bit line in a DRAM memory cell.

BACKGROUND

In semiconductor technology, interconnect arrangements are used to form wiring for semiconductor components. In this case, a dielectric layer or insulating layer is normally formed on an electrically conductive mount substrate, such as a semiconductor substrate, and an electrically conductive interconnect layer is formed on this dielectric layer, with the interconnect layer representing the final interconnect, after structuring. Further insulating layers and electrically conductive layers are then formed successively, thus resulting in a layer stack which allows even complex wiring structures.

The electrical characteristics of the interconnect arrangement in this case depend primarily on the materials used and in particular on the electrical conductivity of the interconnects, as well on parasitic capacitances per area section or length section of the interconnect.

Particularly in semiconductor memory cells such as DRAM memory cells, stored information is transported via a bit line to an evaluation circuit. FIG. 12 shows a simplified equivalent circuit of a conventional DRAM memory cell in which a storage capacitor CS is connected via a selection transistor AT to a bit line BL. The storage capacitor CS can be a trench capacitor or an MIM (metal-insulator-metal) capacitor. The selection transistor AT can be actuated via a word line WL such that the charge or information stored in the storage capacitor CS can be read via the bit line BL. The electrical characteristics of the bit line are determined primarily by their length l and the conductivity per unit length, and the parasitic capacitance CP per unit length and/or unit area. As shown in FIG. 12, the parasitic capacitance CP is charged and discharged with the charge stored in the storage capacitor CS of the memory cell. To attenuate the original signal as little as possible, the parasitic capacitance of the bit line as well as a parasitic line resistance (which is not illustrated) is minimized. To achieve this minimization, the length of the bit lines is optimized.

U.S. Pat. No. 5,461,003 filed on May 27, 1994 and issued on Oct. 24, 1995 discloses an interconnect arrangement in which air gaps or non-conductive gases or a vacuum are/is used to reduce the capacitive coupling between adjacent interconnects. In this case, a porous dielectric covering layer was used for the removal of a sacrificial layer used for the air gap, while at the same time ensuring sufficient mechanical robustness. However, further improvements in the electrical characteristics are obtained.

BRIEF DESCRIPTION OF THE DRAWINGS

The present invention is illustrated by way of example and not limited to the accompanying figures in which like references indicate similar elements. Exemplary embodiments will be explained in the following text with reference to the attached drawings, in which.

Figure 1A:
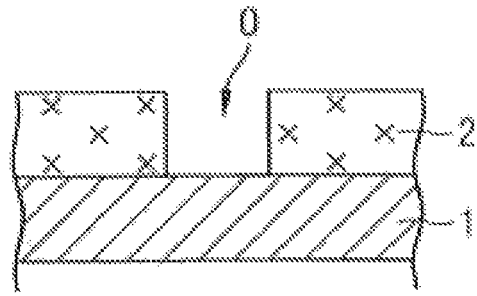
FIGS. 1A-1C to FIGS. 5A-5C show simplified section views and plan views to illustrate fabrication of an interconnect arrangement according to a first exemplary embodiment.

Skilled artisans appreciate that elements in the figures are illustrated for simplicity and clarity and have not necessarily been drawn to scale.

DETAILED DESCRIPTION

An interconnect arrangement and method are disclosed in which a cavity is located at least underneath the interconnect and thus between the interconnect and the mount substrate. This makes it possible to reduce parasitic interconnect/substrate capacitances in semiconductor components such as semiconductor memory cells. The cavity may be bounded by a porous dielectric layer, which at the same time adheres to the interconnect and thus holds it, thus preventing the interconnect from falling or dropping down onto the mount substrate. Alternatively, this mounting option, which may be regarded as suspension of the interconnects, can also be provided by means of a supporting structure. In this case, the dielectric supporting elements, which support the interconnect from underneath, are formed in the cavity.

The interconnect may have a contact via and/or a dummy contact via which lead/leads from the interconnect to the substrate surface and either makes or make electrical contact with or connects or connect to the substrate, or else touch or touches it and are or is not electrically connected to it. Contacts and/or additionally inserted dummy contacts which are present may be used as further supporting structures for the interconnect, thus reliably preventing the interconnect from falling down onto the mount substrate and a short-circuit being formed between the interconnect and the mount substrate.

The interconnect may have a barrier layer to prevent interconnect material from diffusing into the mount substrate. In a similar way, a residual decomposition layer can also be formed in the cavity on the surface of the mount substrate, which can be used in the same way as the barrier layer and is produced, as a byproduct during removal of the sacrificial layer for the cavity.

With regard to the production method, a sacrificial layer is formed on an electrically conductive mount substrate to provide suspension for the interconnects, an interconnect layer is formed on the sacrificial layer, and is structured together with the sacrificial layer. A porous dielectric layer is then formed over the entire surface, and the sacrificial layer is removed to form a cavity underneath the interconnect. This method makes it possible to also produce cavities underneath the interconnects.

A polymer which is thermally stabilized up to about 300-400 degrees Celsius is applied as the sacrificial layer, with thermal conversion being carried out at temperatures from 300 to 600 degrees Celsius for removal of the sacrificial layer allowing the gaseous decomposition products created to escape through the porous layer.

With regard to the alternative production method for provision of a support for interconnects, supporting structures are formed on a mount substrate, a sacrificial layer is then formed over the entire surface and is planarized as far as the surface of the supporting structure to form an interconnect layer on the planarized surface, and to structure it. Finally, the sacrificial layer is removed to form a cavity at least underneath the interconnect, and a closed dielectric covering layer is formed above the interconnects. In consequence, in this alternative, the interconnects are not mounted or suspended from above but are supported from underneath by means of a large number of supporting elements or pillars. The supporting elements may be arranged in straight lines or essentially at right angles to the interconnect, or may contain individual islands over which the interconnects pass.

Turning to the figures, FIGS. 1A to 5C show simplified section views and plan views that illustrate method steps in the production of an interconnect arrangement according to a first exemplary embodiment. In this embodiment, the interconnects are held from above or at the sides by suspension. Each of the Figures C show plan views, with Figures A and B each showing the associated section views along a section A-A and B-B from the associated Figure C.

Figure 1B:
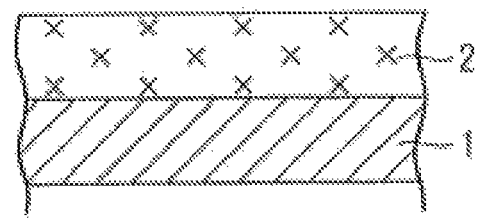
Figure 1C:
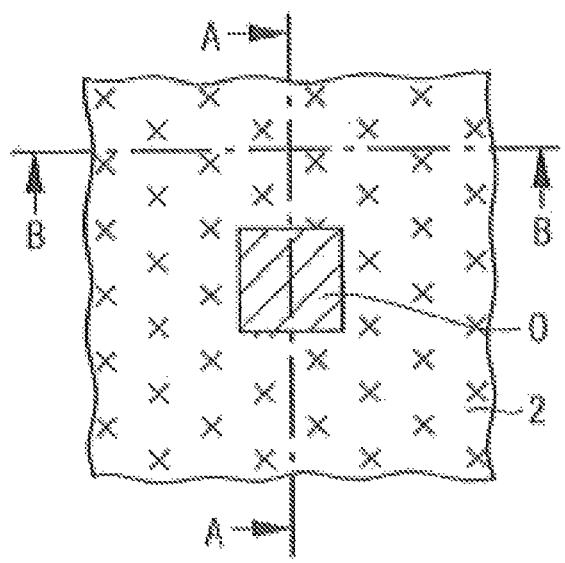

According to FIGS. 1A to 1C, a sacrificial layer 2 is formed on a mount substrate 1 which, for example, represents a semiconductor substrate. The semiconductor substrate can be formed from, for example, monocrystalline silicon. The sacrificial layer 2 may have openings O that extend as far as the mount substrate 1 to provide subsequent contacts. By way of example, a material which is thermally stable up to about 300-400 degrees Celsius (e.g. a polymer) may be applied as the sacrificial layer 2. Polyamides such as Parylene or Teflon may be used for this high-temperature-resistant polymer. These polyamides may be, for example, centrifuged on or deposited by CVD.

Figure 2A:
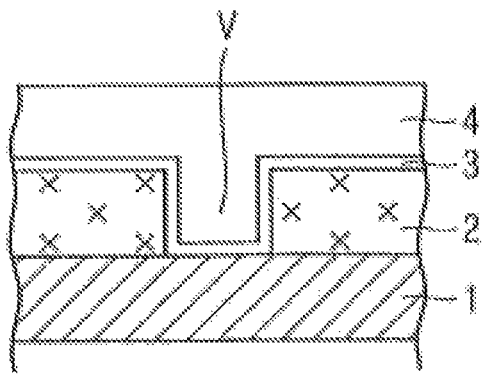
Figure 2B:
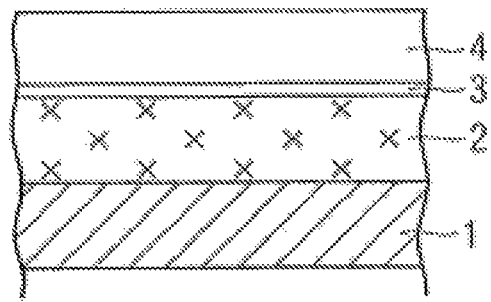
Figure 2C:
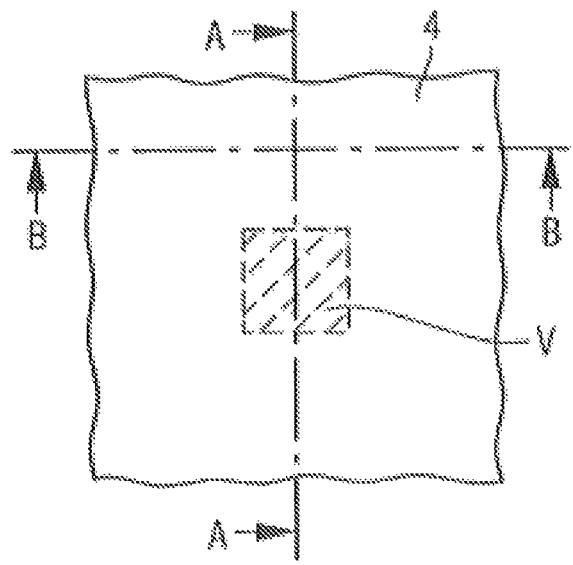

As can be seen from FIGS. 2A to 2C, an optional barrier layer 3 can then be formed on the surface of the sacrificial layer 2 and/or within the opening O and on the surface of the mount substrate 1 as well, to prevent interconnect material that will be formed later from diffusing into the mount substrate 1. By way of example, a TiN layer can be deposited for the optional barrier layer 3 by means of a sputtering method such as PVD (physical vapor deposition). If a barrier layer such as this has been formed, an interconnect layer 4 is then formed over the entire surface, that is to say either directly on the structured sacrificial layer 2 or on the barrier layer 3. By way of example, a tungsten CVD (chemical vapor deposition) method can be used to form an electrically conductive tungsten layer 4, which at the same time also provides a contact via to the mount substrate within the opening O. In metal deposition such as this, the sacrificial layer 2 may have good temperature stability up to at least 300 degrees Celsius. Polyimide, which is thermally stable up to about 450 degrees Celsius, is thus suitable for the sacrificial layer 2.

Alternative methods for formation of the interconnect layer or of the interconnects, such as electroplating methods, are also feasible. In this case, by way of example, a barrier layer is first of all formed on the surface of the sacrificial layer 2 by means of a sputtering method. A plug that is composed of copper, for example, is then produced as a contact via V electrochemically in the opening O. An aluminum layer is then deposited over the entire surface, for example by means of a PVD method, and is structured. For a PVD/electrochemical method such as this, the thermal stability of the sacrificial layer 2 can be considerably less stringent so that it is also possible to use materials which are thermally stable up to only 100 degrees Celsius for the sacrificial layer 2.

Figure 3A:
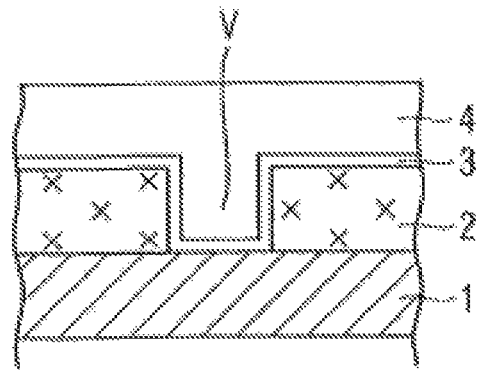
Figure 3B:
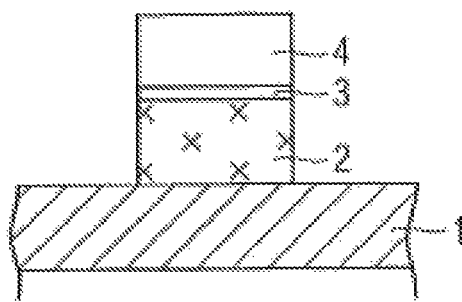
Figure 3C:
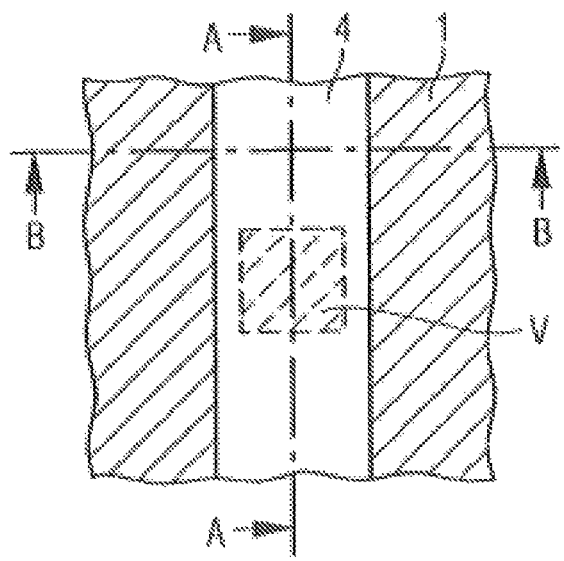

As shown in FIGS. 3A to 3C, the interconnect layer which comprises the barrier layer 3 and the tungsten layer 4 is structured together with the sacrificial layer 2 in a subsequent step, thus resulting in the actual shape and structure of the interconnect. Isotropic etching (RIE, reactive ion etching) can be used. In this case, both single-step and two-step etching processes may be used. In two-step etching processes, the same ion etching process may be used for the sacrificial layer 2 as for the formation of the opening O in FIG. 1A. This results in the interconnects being straight lines or strips as illustrated in FIG. 3, with the sacrificial layer 2 remaining only underneath the interconnects, and with the material otherwise being completely removed as far as the surface of the mount substrate 1. The contact vias V may, of course, be located at points which are covered by the interconnects. The width of the contact vias V may be less than the width of the interconnects.

Although a subtractive structuring method for structuring of the interconnects has been proposed above, the interconnects can also be produced in the same way by means of a damascene or dual damascene process. In this case, respective interconnect depressions or channels are formed in addition to the sacrificial layer 2 in an $SiO_2$ layer, which is not illustrated but is located on the surface of the sacrificial layer, and depressions or channels are then filled with interconnect material, and planarized. Thin barrier and seed layers may be deposited by means of a PVD method, with a copper layer being then deposited by means of an ECD (electrochemical deposition) method, and being planarized by means of a CMP method. Once the $SiO_2$ layer has been etched away and the polymer layer has been structured, during which process a metal web is used as a mask, this results in the same structure as in FIGS. 3A to 3C.

Figure 4A:
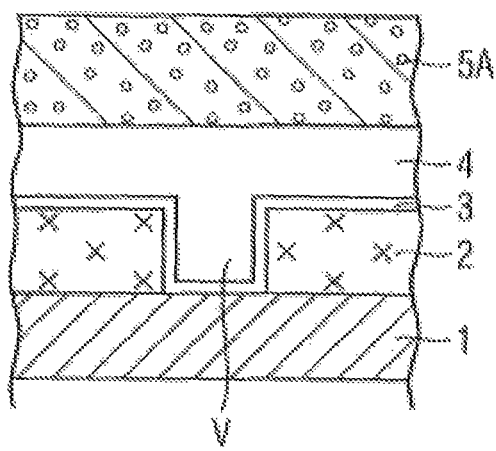
Figure 4B:
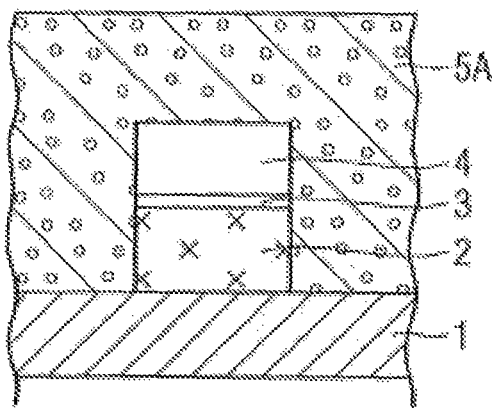
Figure 4C:
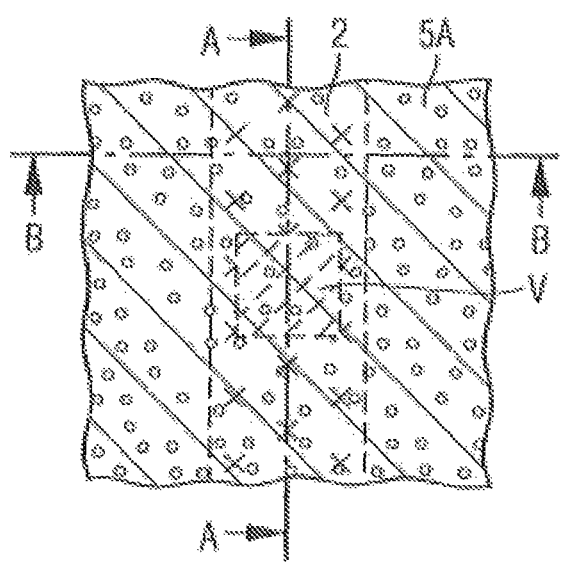

As shown in FIGS. 4A to 4C, a porous dielectric layer 5A is formed on the surface of the mount substrate 1 and of the structured sacrificial layer 2, as well as the interconnect comprising the layer 4 and the optional barrier layer 3. The porous dielectric is deposited, completely fills the gaps between the interconnects and at the same time reliably covers the interconnects. The characteristics of this porous dielectric may be chosen such that a good adhesion capability is provided with the interconnect, for example the tungsten layer 4 and the barrier layer 3, to allow an adequate adhesion force for the interconnect during the subsequent removal of the sacrificial layer 2.

Porous $SiO_2$ may be deposited over the entire surface as the porous dielectric layer, although silicon-dioxide based xerogels can also be centrifuged on, by means of spin-on methods. The pores or openings in this porous dielectric layer 5A may be of such a size that the decomposition products can be reliably dissipated during a subsequent decomposition step.

Figure 5A:
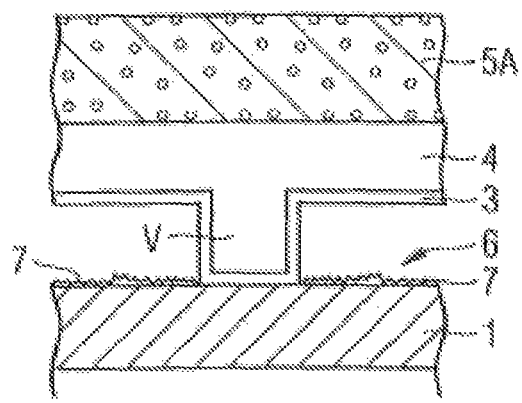
Figure 5B:
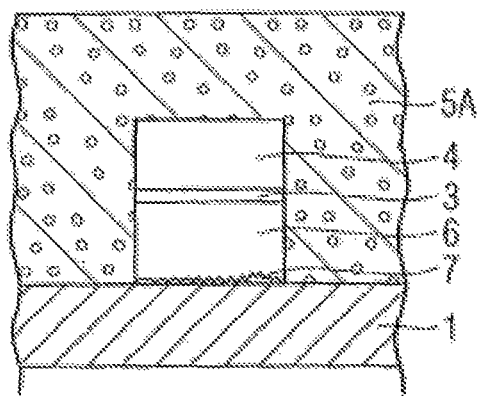
Figure 5C:
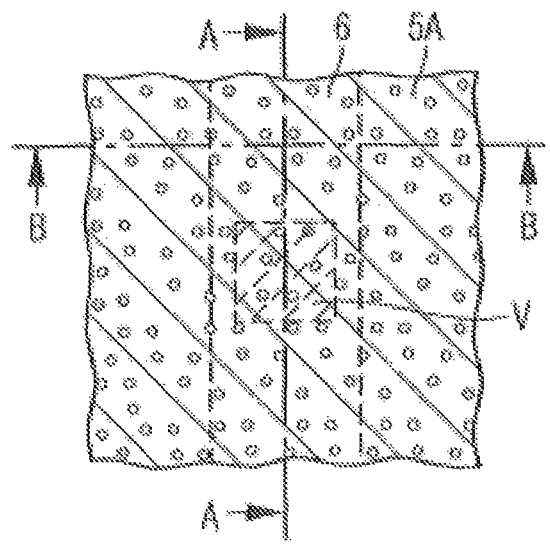

As shown in FIGS. 5A to 5C, the sacrificial layer 2 is now removed to form a cavity 6 underneath the interconnect or the barrier layer 3. In this case, thermal conversion may be carried out on the sacrificial layer 2, with the gaseous decomposition products of the sacrificial layer 2 escaping through the porous layer 5A, and thus creating an air gap or the cavity 6. When polyimide is used as the sacrificial layer 2, the entire layer stack is heated to a temperature of more than 450 degrees Celsius, thus resulting in the polymer or the sacrificial layer 2 being burnt away, and the combustion gases escaping through the porous dielectric 5A. If temperature step exceeds 600 degrees Celsius, however, in producing semiconductor circuits, doped junctions (pn) formed in the semiconductor material can be damaged. If other materials are used as the sacrificial layer 2, heat treatment may even be sufficient in a temperature range from 300 to 600 degrees Celsius. The surrounding atmosphere may be air or pure oxygen, for example.

Alternatively, the sacrificial layer 2 can also be dissolved by means of an acid plasma or hydrogen plasma, and can be dissipated via the pores of the porous dielectric 5A. The air gap or cavity 6 that is created underneath the interconnect does not present any problems since the mechanical robustness is sufficiently ensured by the adhesion or holding forces of the porous layer 5A which is in contact at the sides and on the surface of the interconnect. This results in a dielectric for the parasitic area capacitance between the interconnect and the substrate 1.

Furthermore, during this chemical conversion of the sacrificial layer 2 into gaseous decomposition products, solid residual decomposition products are also deposited or precipitated on the surface of the mount substrate 1 within the cavity 6 as a residual decomposition layer 7. In this case, if suitable materials are used, a diffusion barrier layer can be produced automatically to protect the mount substrate 1 and, for example, a semiconductor substrate. The electrical characteristics of the semiconductor circuit thus remain uninfluenced, while the electrical characteristics of the interconnect are considerably improved, e.g. with respect to the parasitic capacitance.

Figure 12:
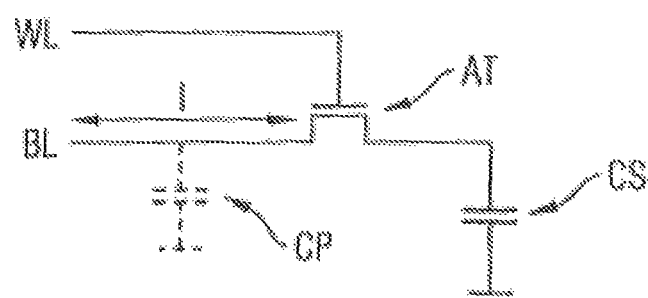
FIG. 12 shows a simplified equivalent circuit of a conventional DRAM memory cell.

When a bit line BL as is illustrated in FIG. 12 is provided, DRAM memory cells can be provided which have greatly improved electrical characteristics in which the size of the storage capacitors CS can be considerably reduced. The integration density is thus considerably increased.

FIGS. 6A to 10D show simplified section views and plan views in order to illustrate method steps in the production of an interconnect arrangement according to a second exemplary embodiment, with provision being made for the interconnect to be supported essentially from underneath.

Although in the first exemplary embodiment described above, it has been possible to considerably improve the parasitic capacitances formed between the interconnects and the electrically conductive mount substrate 1, undesirable parasitic capacitances can still be observed. This results from the areas which are located obliquely underneath the interconnect. Parasitic capacitances such as these which are located at an angle to the interconnect downwards towards the mount substrate 1 have the porous layer 5A as the dielectric. The dielectric constant is approximately k=3.9 when using silicon dioxide.

According to the second exemplary embodiment, a cavity is formed not just immediately underneath the interconnect but an entire plane underneath the interconnect is defined as a cavity, thus resulting in the optimum dielectric constant of k=1 for all parasitic substrate capacitances.

In the description of the following second exemplary embodiment, in which the interconnects are supported from underneath (the support passes through from the mount substrate and virtually the entire plane below the interconnect plane is defined as a cavity), the same reference symbols denote identical or similar layers and elements as in FIGS. 1 to 5, so that they will not be described again in the following text.

Figure 6A:
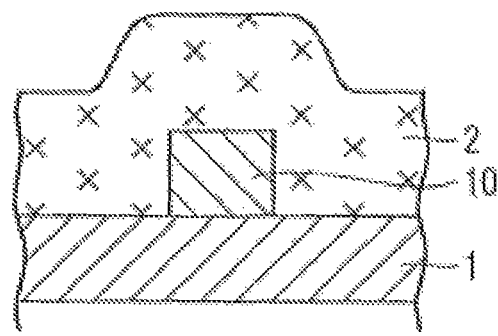
FIGS. 6A-6C to FIGS. 10A-10B show simplified section views and plan views to illustrate fabrication of an interconnect arrangement according to a second exemplary embodiment.
Figure 6B:
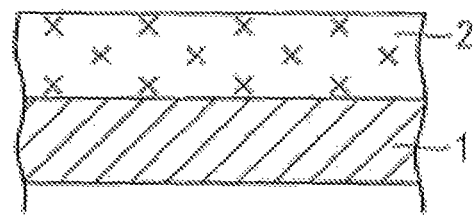
Figure 6C:
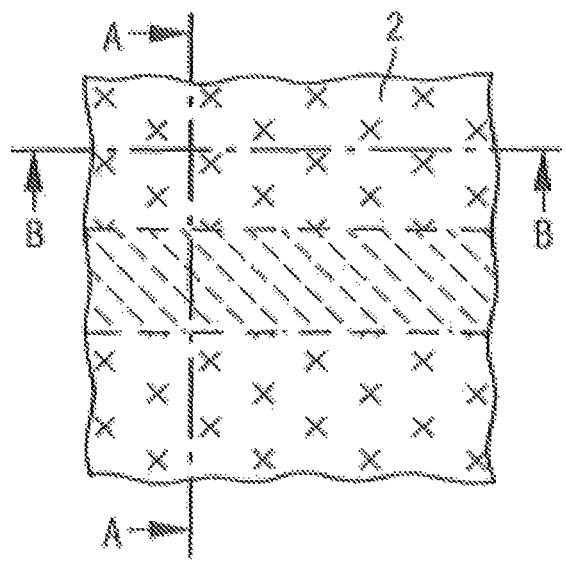

As shown in FIGS. 6A to 6C, a supporting structure 10 for a subsequent interconnect is formed on the mount substrate 1 according to the second exemplary embodiment. For example, dielectric supporting elements are arranged in the form of strips or lines on the surface of the mount substrate 1, and are covered with a sacrificial layer 2. The dielectric supporting structure is produced by deposition of a non-porous $SiO_2$ layer that is subsequently structured. In this case, anisotropic dry etching processes can be used for structuring, although wet etching processes can also be used. As an alternative to the $SiO_2$ material being used for the dielectric supporting structure 10, it is also possible to use low-k materials (materials whose dielectric constant k is considerably less than that of silicon dioxide). The k value of the dielectric constant of silicon dioxide is about 3.9, and is used as a reference value for classification of low-k and high-k materials.

Although the materials mentioned above, such as temperature-resistant polyimide, may be used for the sacrificial layer 2, $Si_3N_4$ can alternatively be used for the supporting structure 10 as well. $SiO_2$ can be used for the sacrificial layer 2, with RF etching being carried out in a subsequent removal step to remove the sacrificial layer 2. Since $Si_3N_4$ and $SiO_2$ are available in every standard process, this results in a simple implementation. The second exemplary embodiment will also be described in the following text for a polymer of the sacrificial layer 2 and for $SiO_2$ as the supporting structure 10.

Figure 7A:
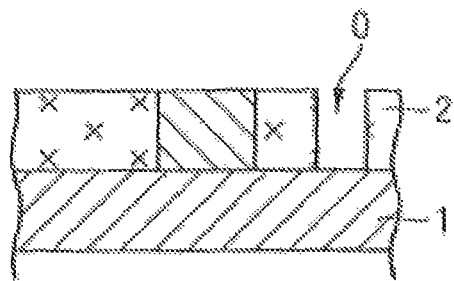
Figure 7B:
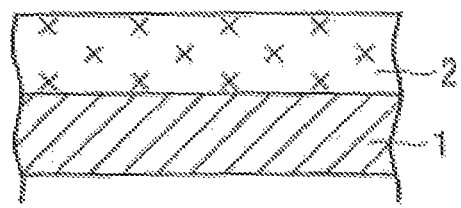
Figure 7C:
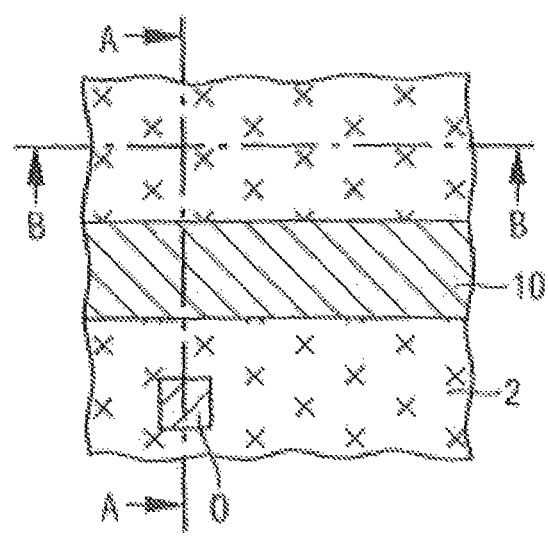

As shown in FIGS. 7A to 7C, the sacrificial layer 2 is planarized to expose a surface of the supporting structure 10. The polymer 2 may be polished back to the upper edge of the supporting structure 10 by means of a CMP method. Furthermore, any contact openings O are formed at this time, as in the exemplary embodiment 1 by etching of the sacrificial layer 2 as far as the mount substrate 1.

Figure 8A:
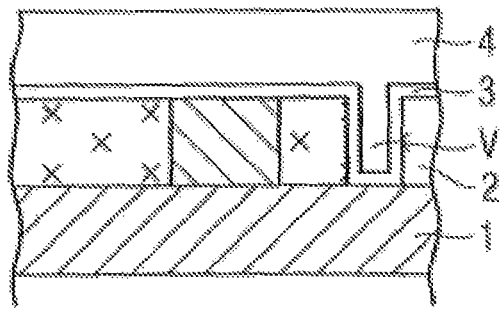
Figure 8B:
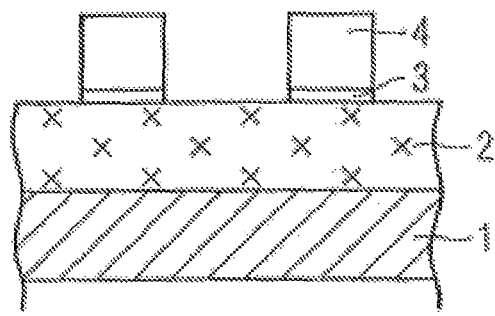
Figure 8C:
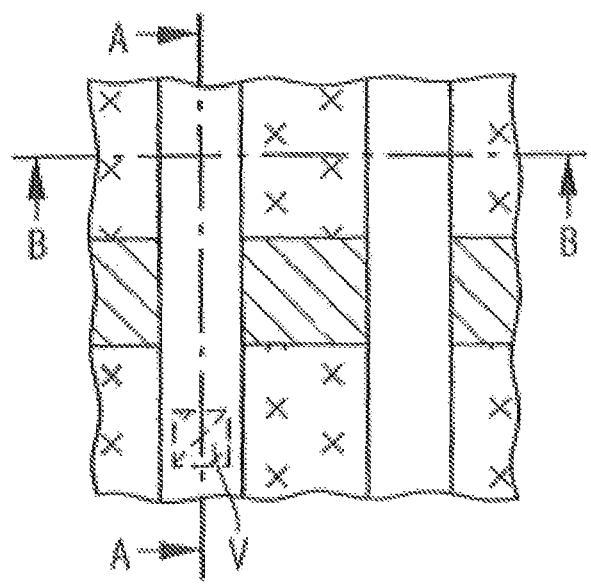

As shown in FIGS. 8A to 8C, an interconnect layer 4, possibly with an optional barrier layer 3, is now once again formed on the planarized surface (on the surface of the sacrificial layer 2 and of the supporting structure 10). In this case, a contact via V or else a dummy contact via can once again be provided within the contact opening O as in the first exemplary embodiment. The contact vias V allow electrical contact with the mount substrate 1, while no electrical contact is produced in the dummy contact vias, for example because of an insulating base layer (which is not illustrated) between the interconnect 4 and the mount substrate 1. Once again, either the CVD methods described above for deposition of tungsten or the PVD/electrochemical method mentioned above is carried out, in which a copper plug is formed electrochemically in the contact via, with an aluminum layer being deposited above this by means of a sputtering method. The temperature requirements for the sacrificial layer 2 are correspondingly different for the exemplary embodiment 1.

Furthermore, as shown in FIGS. 8A to 8C, the interconnect layer that comprises, for example, the tungsten layer 4 and the barrier layer 3 is also structured, thus resulting in the normal interconnects in the form of straight lines and strips. When using a supporting structure in the form of straight lines and strips, the interconnects may be arranged essentially at right angles to the supporting structure 10, thus making it possible to produce a very simple design. However, the supporting structures can also be arranged at any desired angle to the interconnects.

As in the case of the first exemplary embodiment, as an alternative to the subtractive structuring processes described above for production of the structured interconnects by means of photoresistive lacquer, exposure and subsequent etching, the interconnects can also be formed by means of a damascene or dual-damascene process. In this case, as shown in FIGS. 7A to 7C after the planarization, an $SiO_2$ layer is once again formed on the surface of the sacrificial layer 2, with the subsequent interconnect lines being produced by means of trenches in this $SiO_2$ layer. As in the first exemplary embodiment, thin barrier and seed layers can once again be deposited by means of a PVD method, with a copper layer being deposited on this by means of an ECD method, and being planarized by means of a CMP method.

As is illustrated in FIGS. 8A and 8B, the sacrificial layer 2 may remain complete, for example, during this etching process. However, it can also be partially removed, as in FIG. 3B.

Figure 9A:
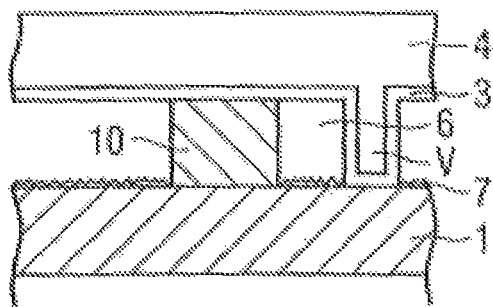
Figure 9B:
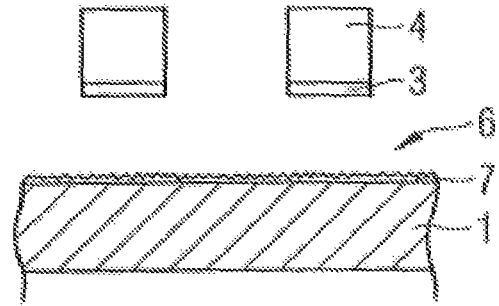
Figure 9C:
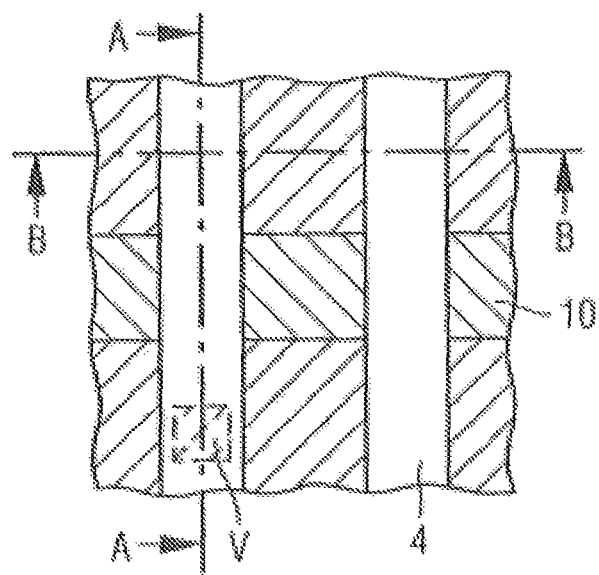

As shown in FIGS. 9A to 9C, the sacrificial layer 2 is then completely removed to form a cavity 6, which is virtually complete except for the supporting elements 10 and covers at least the entire plane underneath the interconnect or interconnects 3, 4. As in the case of the first exemplary embodiment, thermal conversion can once again be carried out, with the polymer being chemically converted or burnt away at temperatures of 300 to 600 degrees Celsius. Once again, a residual decomposition layer 7 can also be formed on the surface of the mount substrate 1, if desired as a further barrier layer to prevent materials from diffusing from the interconnect into the semiconductor material.

The open arrangement in the second exemplary embodiment means that, as an alternative to this thermal conversion or to the use of the alternatively described oxygen or hydrogen plasmas, it is also possible to use conventional isotropic etching processes such as an RF wet etching process, in which case $Si_3N_4$ can also be used as the supporting structure 10 and $SiO_2$ as the sacrificial layer 2. The materials for the barrier layer 3 and the actual interconnect layer 4 can be chosen appropriately such that no on-etching is carried out during this removal of the sacrificial layer 2. Furthermore, isotropic plasma etching can alternatively be carried out, by which means the sacrificial layer 2 is completely removed. In consequence, the interconnects are supported or borne from underneath only by the supporting structure 10 and, possibly, by the contact vias V or optional dummy contact vias.

Figure 10A:
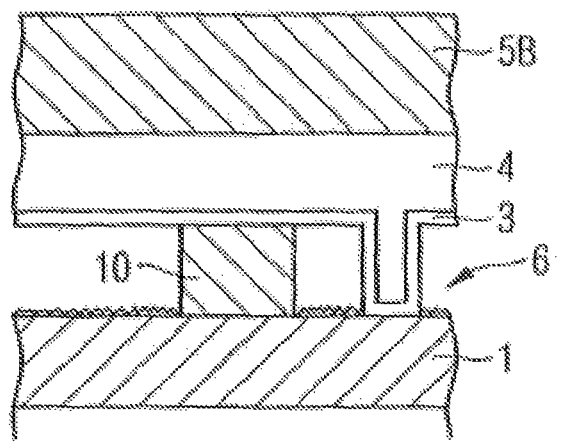
Figure 10B:
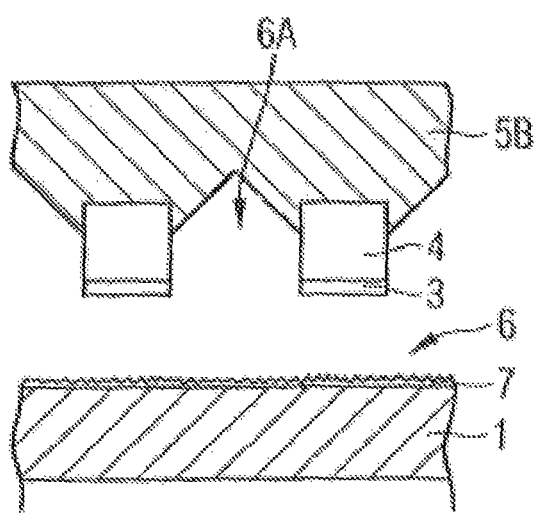

As shown in FIGS. 10A and 10B, a closed dielectric covering layer 5B is formed above the interconnect 3, 4 in a final step. In this case, a non-porous dielectric (for example $SiO_2$) may be deposited non-conformally such that the gaps between the interconnects or bit lines are completely closed, and a flat plane can be produced for a subsequent layer structure. For a non-conformal deposition method such as this, the interconnects are only partially covered by dielectric on their side surfaces, so that a side cavity 6A can also be produced in an advantageous manner between adjacent interconnects.

In this second exemplary embodiment, this results in the greatest possible reduction in the parasitic capacitances both with respect to the mount substrate 1 and with respect to adjacent interconnects, since not only does the entire plane below the interconnects contain a cavity 6, and is thus filled with air or a non-conductive gas or a vacuum, but a cavity 6A with an optimum k value of k=1 is also produced, at least partially, at the side alongside the interconnects. In conjunction with the non-conformal covering layer 5B, that is to say the layer with a different layer thickness, the supporting structure 10 and the contact vias V are sufficiently mechanically robust to allow further metallization levels in subsequent layers.

Figure 11:
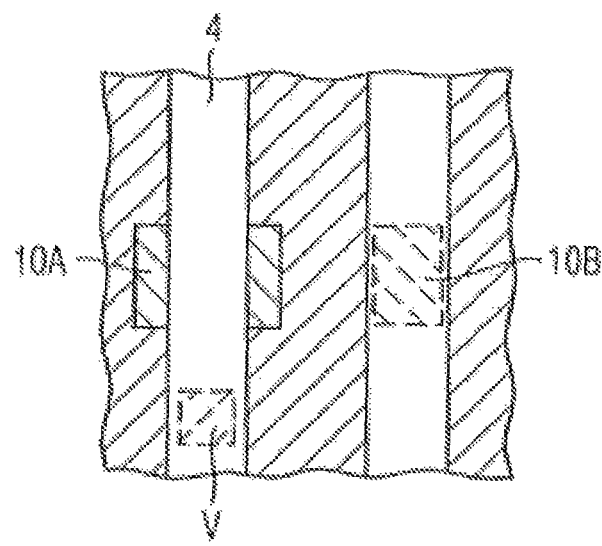
FIG. 11 shows a simplified plan view of an interconnect arrangement according to a third exemplary embodiment.

FIG. 11 shows a simplified plan view of an interconnect arrangement according to a third exemplary embodiment in which the supporting structure is essentially in the form of islands. In this case, rectangular supporting elements 10A project beyond the interconnect width at the sides or, as square supporting elements 10B, also have a narrower width than the interconnect width. This embodiment results in a further slight improvement in the parasitic capacitances.

This results in an interconnect arrangement in which the parasitic capacitances have been reduced to the greatest possible extent, with a cavity being formed at least immediately underneath the interconnect or between the interconnect and the mount substrate. This cavity can run in the form of a tunnel just underneath the interconnects, or can occupy the entire plane underneath the interconnects, or may even extend laterally between the interconnects.

For example, when using an interconnect arrangement such as this as a bit line in a semiconductor memory cell as shown in FIG. 12, the storage capacitors CS shown in this figure can be considerably reduced, and the electrical characteristics, such as the read speeds, can be considerably increased.

The invention has been explained above with reference to selected materials. However, it is not restricted to these materials and in the same way also covers other alternative materials which are used for production of the cavities in conjunction with the holding and supporting elements. Furthermore, combinations of the exemplary embodiments mentioned above are also possible, with the use of porous materials for the covering layer 5B also being mentioned. In the same way, the present invention is not restricted just to interconnect arrangements in the field of semiconductor technology, but in the same way covers all other interconnect and conductor track arrangements, for example in printed circuits etc., in which the electrical characteristics of the interconnects and conductor tracks and the parasitic capacitances are important.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

What is claimed is:

1. A method for production of an interconnect arrangement, the method comprising:
    a) forming a sacrificial layer on an electrically conductive mount substrate;
    b) forming an interconnect layer on the sacrificial layer;
    c) subtractively structuring the interconnect layer and the sacrificial layer to produce a structured interconnect on the structured sacrificial layer, said subtractive structuring comprising an ion etching process;
    d) after producing the structured interconnect, forming a porous dielectric layer on a surface of the mount substrate and a surface of the structured interconnect as well as a surface of the sacrificial layer; and
    e) removing the sacrificial layer to form a cavity under the structured interconnect.

2. The method of claim 1, wherein, in a), an opening for a contact via or a dummy contact via is formed in the sacrificial layer.

3. The method of claim 1, wherein, in e) thermal conversion of the sacrificial layer is carried out in a temperature range from 300 to 600 degrees Celsius, with the gaseous decomposition products escaping through the porous layer.

4. The method of claim 1, wherein, in e), a residual decomposition layer is formed on the surface of the mount substrate.

5. The method of claim 1, wherein the substractively structuring the interconnect layer and the sacrificial layer includes etching the interconnect layer and the sacrificial layer.

6. The method of claim 5, wherein the etching is a single step etching.

7. The method of claim 5, wherein the etching is a dual step etching.

8. The method of claim 5, wherein the etching comprises an isotropic etching.

9. The method of claim 5, wherein the etching comprises a reactive ion etching.

10. The method of claim 1, wherein the interconnect layer comprises aluminum.

* * * * *